United States Patent
Grebs et al.

(10) Patent No.: US 9,496,388 B2
(45) Date of Patent: Nov. 15, 2016

(54) TRENCH MOSFET HAVING REDUCED GATE CHARGE

(71) Applicant: Texas Instruments Incorporated, Dallas, TX (US)

(72) Inventors: Thomas Eugene Grebs, Bethlehem, PA (US); Touhidur Rahman, Allentown, PA (US); Christopher Boguslaw Kocon, Mountain Top, PA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/069,089

(22) Filed: Mar. 14, 2016

(65) Prior Publication Data
US 2016/0197178 A1    Jul. 7, 2016

Related U.S. Application Data

(62) Division of application No. 14/291,913, filed on May 30, 2014, now Pat. No. 9,318,598.

(51) Int. Cl.
*H01L 29/78* (2006.01)
*H01L 29/08* (2006.01)
(Continued)

(52) U.S. Cl.
CPC ......... *H01L 29/7813* (2013.01); *H01L 29/063* (2013.01); *H01L 29/0696* (2013.01); *H01L 29/0865* (2013.01); *H01L 29/0882* (2013.01); *H01L 29/1095* (2013.01); *H01L 29/402* (2013.01); *H01L 29/407* (2013.01); *H01L 29/41741* (2013.01); *H01L 29/4236* (2013.01); *H01L 29/7803* (2013.01); *H01L 29/7804* (2013.01); *H01L 29/7805* (2013.01); *H01L 29/7806* (2013.01); *H01L 29/7811* (2013.01); *H01L 29/861* (2013.01)

(58) Field of Classification Search
CPC ............ H01L 29/402; H01L 29/7804; H01L 29/7805; H01L 29/7806; H01L 29/7813; H01L 29/0696; H01L 29/861; H01L 29/063; H01L 29/4236; H01L 29/41741
See application file for complete search history.

(56) References Cited

U.S. PATENT DOCUMENTS

| | | |
|---|---|---|
| 7,745,878 B2 | 6/2010 | Bhalla et al. |
| 2009/0065814 A1 | 3/2009 | Bhalla et al. |
| 2009/0072301 A1 | 3/2009 | Bhalla et al. |
| 2013/0168760 A1 | 7/2013 | Hsieh |

(Continued)

OTHER PUBLICATIONS

Jacek Korec, et al., "History of FET Technology and the Move to NexFET," Power Stage Group, Texas Instruments, Bodo's Power Systems, May 2009, pp. 44-45.

*Primary Examiner* — Joseph C Nicely
(74) *Attorney, Agent, or Firm* — Tuenlap D. Chan; Frank D. Cimino (57) ABSTRACT

A trench MOSFET device includes a semiconductor layer of a first doping type. MOS transistor cells are in a body region of a second doping type in the semiconductor layer. The transistor cells include a first cell type including a first trench providing a first gate electrode or the first gate electrode is on the semiconductor surface between the first trench and a second trench, and a first source region is formed in the body region. The first gate electrode is electrically isolated from the first source region. A second cell type has a third trench providing a second gate electrode or the second gate electrode is on the semiconductor surface between the third trench and a fourth trench, and a second source region is in the body region. An electrically conductive member directly connects the second gate electrode, first source region and second source region together.

20 Claims, 3 Drawing Sheets

(51) Int. Cl.
*H01L 29/06* (2006.01)
*H01L 29/861* (2006.01)
*H01L 29/10* (2006.01)
*H01L 29/40* (2006.01)
*H01L 29/423* (2006.01)
*H01L 29/417* (2006.01)

(56) References Cited

U.S. PATENT DOCUMENTS

2013/0313638 A1 11/2013 Yoshimochi
2015/0349110 A1 12/2015 Kocon
2015/0357459 A1* 12/2015 Kocon ............... H01L 29/7804
  257/328

* cited by examiner

|  | | "ACTIVE CELL" % | | | | PRIOR ART |
|---|---|---|---|---|---|---|
|  | UNIT | 20% | 40% | 60% | 80% | 100% |
| SUBSTRATE THICKNESS | mil | 4.00 | 4.00 | 4.00 | 4.00 | 4.00 |
| Ron @ 4.5V | mΩ | 12.07 | 7.79 | 6.38 | 5.67 | 5.25 |
| Ron @ 8.0V | mΩ | 6.42 | 4.98 | 4.50 | 4.26 | 4.12 |
| Ron @ 10.0V | mΩ | 5.63 | 4.59 | 4.24 | 4.07 | 3.97 |
| CISS @ VDSmax/2 | pF | 293.11 | 586.35 | 878.77 | 1171.00 | 1463.60 |
| COSS @ VDSmax/2 | pF | 118.70 | 118.70 | 118.70 | 118.70 | 118.70 |
| CRSS @ VDSmax/2 | pF | 15.62 | 31.24 | 46.85 | 62.46 | 78.00 |
| Qgth | nC | 0.61 | 1.22 | 1.82 | 2.42 | 3.02 |
| Qgs | nC | 0.67 | 1.34 | 1.94 | 2.58 | 3.21 |
| Qgd | nC | 0.50 | 1.00 | 1.42 | 1.98 | 2.54 |
| Qgs @ 4.5V | nC | 1.58 | 3.22 | 4.71 | 6.34 | 7.94 |
| Qgs @ 8.0V | nC | 2.55 | 5.16 | 7.63 | 10.23 | 12.79 |
| Qgs @ 10.0V | nC | 3.10 | 6.27 | 9.29 | 12.44 | 15.57 |
| Qgd*Ron @ 4.5V | nC.mΩ | 6.01 | 7.79 | 9.03 | 11.20 | 13.34 |
| Qgs*Ron @ 4.5V | nC.mΩ | 19.02 | 25.06 | 30.07 | 35.96 | 41.66 |
| Qgs*Ron @ 8.0V | nC.mΩ | 16.35 | 25.69 | 34.32 | 43.56 | 52.70 |
| Qgs*Ron @ 10.0V | nC.mΩ | 17.47 | 28.77 | 39.39 | 50.65 | 61.79 |

FIG. 3

TRENCH MOSFET HAVING REDUCED GATE CHARGE

CROSS-REFERENCE TO RELATED APPLICATIONS

Under 35 U.S.C. §§120 and 121, this divisional application claims priority to and benefits of U.S. patent application Ser. No. 14/291,913 (TI-72889), filed on May 30, 2014, the entirety of which is incorporated herein by reference.

FIELD

Disclosed embodiments relate to trench metal oxide field effect transistors (MOSFETs).

BACKGROUND

Shrinking feature size has been the trend in semiconductor device ever since the advent of integrated circuit (IC) devices. Overall, smaller feature size improves device performance. Examples evidencing this improvement are reflected in the increase of memory device capacity and the increase of the computing power of microprocessors. The push for higher packaging density also leads to 3-dimensional (3D) processing, which place components that used to be located at the top surface of the device inwardly into the body of the device. Examples of such processes are through-silicon-vias (TSVs) and trench metal-oxide-semiconductor field-effect transistors (MOSFETs).

One trench MOSFET design referred to herein as a "planar gate trench MOSFET" has a planar gate structure with polysilicon filled trenches as field plates (sometimes referred to as "RESURF trenches) on both sides of the gate stack, a source in the semiconductor surface between the gate stack and the trenches, and a drain on the bottom surface of the device. For purposes of this patent application, the term "RESURF" is understood to refer to a region/material which reduces an electric field in an adjacent semiconductor region. A RESURF region may be for example a semiconductor region with an opposite conductivity type from the adjacent semiconductor region. RESURF structures are described in Appels, et. al., "Thin Layer High Voltage Devices" Philips J, Res. 35 1-13, 1980.

In contrast to a planar gate trench MOSFET, a trench gate MOSFET, sometimes referred to simply as a trench MOSFET, comprises a trench gate structure that is recessed and perpendicularly oriented relative to the semiconductor surface. A significant feature of trench gate MOSFETs is that it lacks the Junction Field Effect Transistor (JFET) effect.

In the case of a power trench MOSFET, whether it is a planar gate trench MOSFET or a trench gate MOSFET (collectively a "trench MOSFET"), it is common to lay out multiple transistor cells arranged physically and electrically in parallel across the area of the device. Each cell of a trench MOSFET has three separate electrical terminals, the source which is normally shorted to the body, the drain, and the gate. In a switching application, the trench MOSFET operates either in an on-state in which current passes vertically between the source terminal and the drain terminal, or in an off-state in which virtually no current passes between the source and drain terminals. The operation of switching on and switching off for MOSFETs including trench MOSFETs can be modeled by the charging and discharging of a combination of equivalent capacitors between the gate electrode and the body, the source, and the drain. The time it takes to charge and discharge these capacitors determines the switching speed of the MOSFET.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize the reduction of the cell pitch for a trench metal-oxide-semiconductor field-effect transistor (MOSFET) enables higher cell density and reduced on-resistance (Rdson or Ron) as a consequence, which leads to reduction of power loss during device operation. As used herein, the term "trench MOSFET" includes both trench gate MOSFETs and planar gate MOSFETs having active area trenches or RESURF trenches (hereafter "planar gate trench MOSFETs") on both sides of the gate stack. The Inventors discovered that incidental to the reduction of the Rdson provided, the capacitance of the trench MOSFET, especially of the trench gate MOSFET, due to its inherent process tolerances, increases as the interface area between the gate and the channel region, and the amount of overlap area between the gate and the source, and between the gate and drain accumulate. This increase in capacitance can more than negate the advantage in the reduction of Rdson obtained from reduced cell pitch in overall trench MOSFET performance.

With this recognition, trench MOSFETs are described herein including a plurality of cells having cells including a first transistor cell type (first transistor cell) that functions as a conventional active transistor cell which include conventional separate source, drain and gate, and also cells having a non-standard second transistor cell type (second transistor cell) where the gate and source are intentionally shorted together, that along with the drain functions as a diode connected transistor, which when the respective cells are combined, provides enhanced trench MOSFET device performance. The improvement in performance provided is significant for both planar gate trench MOSFETs and trench gate MOSFETs, but has been found to be more significant with trench gate MOSFETs as they have a higher gate charge (Qg) as compared to planar gate trench MOSFETs. The ratio of first transistor cells to second transistor cells (where the gate and source are shorted) utilized in a given MOSFET design together generally depends on the specific circuit application and objective, keeping in mind that when shorting the gate to the source there is a slight Rdson penalty for the overall MOSFET device.

One disclosed aspect is directed to a trench MOSFET having first transistor cells and second transistor cells that achieves superior performance through balance of device Rdson and capacitance. Overall, the trench MOSFET device includes a plurality of source contact holes over sources and a plurality of gate contact holes over gate electrodes, in which for the diode connected transistor cells (second transistor cells) the gate contact holes and source contact holes are shorted by a continuous electrically conductive member, such as a doped polysilicon line or a metallic line. The remaining gate contact holes associated with the conventional active transistor cells (first transistor cells) are connected by a second continuous conductive member such as a doped polysilicon line or a metallic line, and their source contact holes by a third continuous conductive member. The second and third conductive members are not connected to each other.

With this layout, the gates of the diode connected transistor cells being shorted to their source do not contribute to the device capacitance of the trench MOSFET. Trench MOSFET devices including this disclosed cell structure therefore provide a reduction in capacitance, which results in a faster switching speed.

BRIEF DESCRIPTION OF THE DRAWINGS

Reference will now be made to the accompanying drawings, which are not necessarily drawn to scale, wherein.

DETAILED DESCRIPTION

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like such as "connected to") as used herein in the electrical context without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Figure 1:
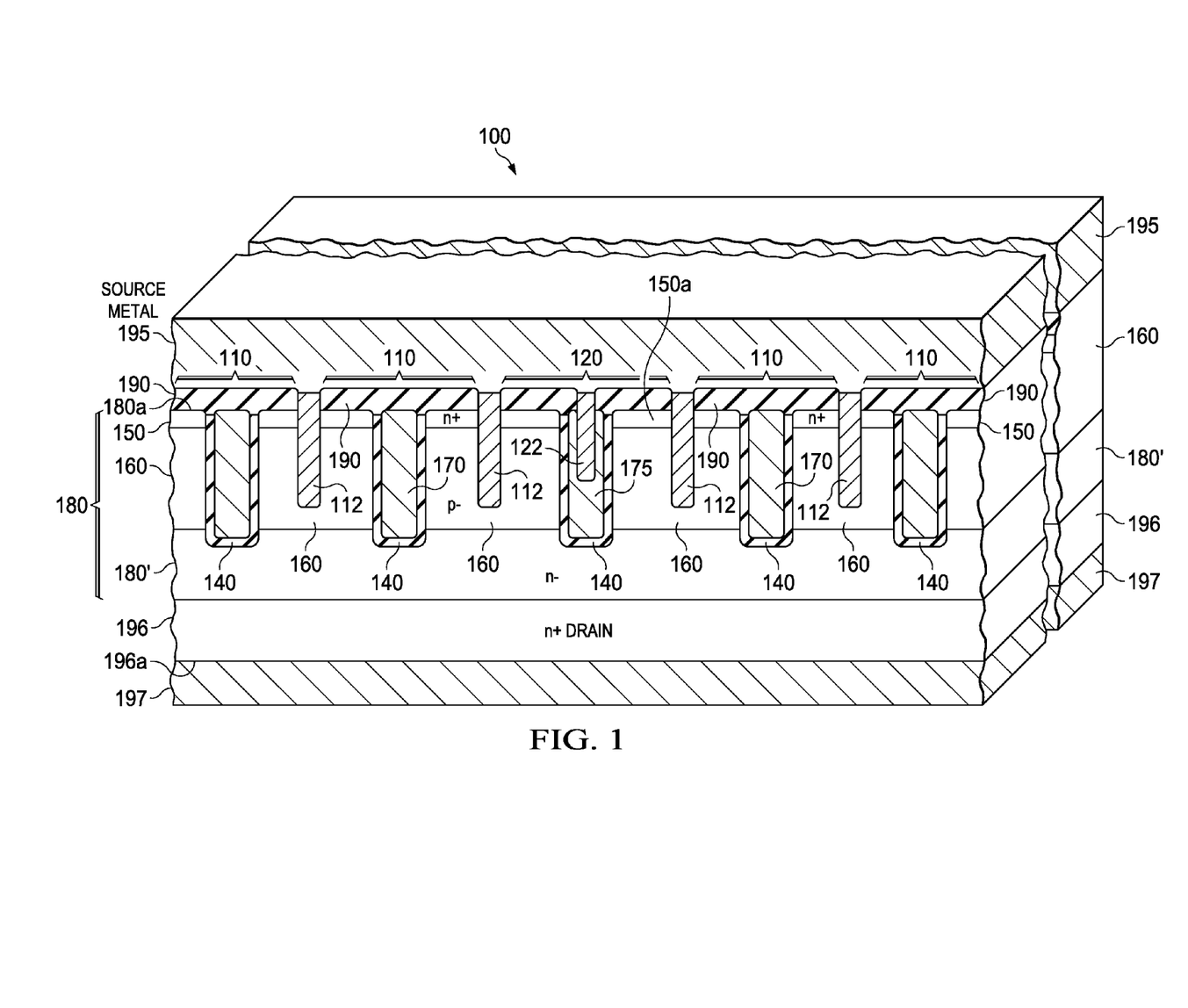
FIG. 1 depicts a cross sectional view of an example trench gate MOSFET including a plurality of conventional transistor cells and a diode connected transistor cell, according to an example embodiment.

FIG. 1 depicts a cross sectional view of an example trench gate MOSFET device 100 (trench gate MOSFET 100) shown as being an n-channel device (NMOS) comprising several MOSFET cells including conventional first transistor cells and a second transistor cell providing a diode connected transistor cell, which embodies disclosed embodiments. The 5 cells shown include cells 110 comprising a conventional active transistor cell type (conventional active transistor cell 110) with four such cells shown, along with a cell 120 representing a diode connected transistor cell 120 (diode connected transistor cell 120). Although generally described herein as being NMOS devices, disclosed MOSFET devices may also be PMOS. Moreover, in a practical device, there may be hundreds or thousands of cells electrically in parallel, typically with a repetition of a pattern of diode connected transistor cells 120, such as a diode connected transistor cells 120 every Nth cell.

Trench gate MOSFET 100 is formed on a substrate 196 shown as an n+ substrate that provides a drain for the device having an n– epitaxial semiconductor layer 180 thereon which provides an n– drain drift region. The n+ substrate 196/semiconductor layer 180 can comprise silicon; alternatively, the n+ substrate 196/epitaxial semiconductor layer 180 may comprise other semiconductor materials such as germanium, silicon carbide, gallium nitride, gallium arsenide, etc. A p– doped body region 160 is formed in the semiconductor layer 180, where n+ doped source regions 150 are formed at the surface 180a of the semiconductor layer 180 within the body regions 160.

Conductor filled dielectric lined gate trenches 170/140 and 175/140 provide the gate structure for the respective cells 110, 120. The gate trench walls are lined with a dielectric film 140 (or liner) that functions as a gate dielectric. In this embodiment, the dielectric film material can be silicon dioxide. Alternatively, the dielectric film material may comprise other dielectric material such as silicon nitride, or other dielectrics. The dielectric lined trenches are filled with polysilicon or other electrically conductive material such as tungsten to form the gate electrode shown as 175 for the diode connected transistor cell 120 and gate electrode 170 for the conventional active transistor cells 110.

The gate trenches can be etched from the surface 180a of the epitaxial semiconductor layer 180. In this embodiment, the five depicted gate trenches can be processed concurrently with a pattern step and then an etch step. The trench gate MOSFET 100 in this embodiment can be formed by a process flow for conventional trench MOSFETs such as including ion implantation or dopant diffusion to form the body regions 160 and the source regions 150.

The surface 180a of the semiconductor layer 180 is shown covered with a dielectric film 190. In this embodiment, the dielectric film 190 can comprise silicon oxide or silicon oxynitride. Alternatively, the dielectric film 190 may comprise other dielectric materials as known in the art of semiconductor device fabrication.

As shown in FIG. 1, the conventional active transistor cells 110 and diode connected transistor cell 120 both include source/body contact holes 112 which are formed through the top surface 180a of the semiconductor layer 180 between the gate trenches through the source regions 150 and the body regions 160. Although the source/body contact holes 112 are shown in FIG. 1 extending into the semiconductor layer 180, disclosed embodiments also include the option of having planar source/body contacts. The depth of source/body contact holes 112 does not impact the disclosed concept of shorting every Nth gate to the source to provide diode connected transistor cells 120. However, the depth of the source/body contact holes 112 can change the device performance, because if too shallow a desired short from the source 150a to the body region 160 may not be provided, and if too deep then the breakdown voltage (BV) of the device may be reduced and its threshold voltage (Vth) may also be changed.

Once filled with an electrical conductor shown as source metal layer 195 the contact holes short the source regions 150 to the body regions 160 of each cell type 110 and 120, and short the gate to the source for only the diode connected transistor cell 120. Source metal layer 195 can be more generally any electrically conductive material such as tungsten or doped polysilicon, which in operation is generally grounded.

Diode connected transistor cell 120 is shown including a gate contact hole 122 that is etched into its gate electrode 175. The depth of the gate contact hole 122 may or may not be the same as that of source/body contact holes 112. This is because while the mesa regions of semiconductor layer 180 in this embodiment is generally a single crystal material such as silicon, the gate electrode 175 generally comprises polysilicon or other electrically conductive material. Unless the single crystal (e.g., silicon) and the electrically conductive gate electrode 170 and 175 material in the trenches such as polycrystalline have identical etch rates with respect to the etching chemistry used, the dimensions of the gate contact hole 122 may be different from that of the contact source/body holes 112 in the mesa regions.

The backside 196a of the n+ substrate 196 of the trench gate MOSFET 100 in FIG. 1 is shown covered with a separate metal film 197. This metal film 197 makes a low resistance ohmic contact to the n+ substrate 196 which provides the drain region, which in operation is connected to Vds. Alternatively, metal film 197 may be omitted and the backside 196a of the n+ substrate 196 may instead be mounted to a die pad of a leadframe. The gate electrodes 170 of the conventional active transistor cells 110 are separately tied together by another metal or doped polycrystalline element (not shown) which is connected to the gate electrode terminal of the device package.

When trench gate MOSFET 100 is an enhancement device, provided the device is properly biased between gate and source, an inversion channel forms in the mesa region between the source region 150 and the drain drift region 180', adjacent to the dielectric film 140 that lines the trench walls. When an appropriate potential difference is established between the source terminal and the drain terminal, electrical current flows vertically through the channel. If the body region is doped more heavily with n-type dopant (PMOS), the current is carried through the channel by holes; if it is doped more heavily with p-type dopant (NMOS) as shown in FIG. 1, electrons.

It takes a finite amount of time for a MOSFET device to reach this operating condition after external voltages are applied to the device terminals. In a simplified model, the trench gate MOSFET 100 may be viewed as a combination of capacitor components, among them there is a gate to body capacitor, a gate to source capacitor, and a gate to drain capacitor.

When the trench gate MOSFET 100 is used as a power switch in an electrical circuit, the amount of time it takes to charge and discharge each of the capacitive components determines the switching speed of the device. As the number of cells increase per unit area due to the shrinking feature size of individual trench MOSFET cells, and thus an increased cell pitch, the total capacitance of the device increases proportionally, where the total capacitance is roughly the arithmetic sum of the individual cell capacitance. As a result, a trench gate MOSFET device with a greater number of trench gate MOSFET cells switches slower.

The trench gate MOSFET 100 also has resistive components, among them there is a resistance associated with the metal (or other conductor) lead, the finer the lead width, the higher the resistance per unit length. There is also resistance associated with contacts such as associated with the source/body contact holes 112. And there is resistance associated with the n+ substrate 196 and the drain drift region 180' on the n+ substrate 196. The total resistance of the trench gate MOSFET 100 determines the power loss when the device is conducting current. The higher the device resistance when the switch is in its "on" state, Rdson, the more the power loss.

The performance of a trench MOSFET as a power switching device is sometimes designated by the product of the Rdson and the total charge that is needed to fully bias the device terminals (Qg) being the figure of merit for the device (FOM), with a lower FOM reflecting better device performance. The Inventors discovered that while the trench MOSFET's capacitance increases linearly with the number of trench MOSFET cells per unit area, the total Rdson decreases at a slower rate. With this recognition, the Inventors configured trench MOSFET device structures with improved FOM heretofore not achieved.

As shown in FIG. 1, the diode connected transistor cell 120 has its gate electrode 175 directly connected to the source metal layer 195 and to its source region 150, where the source metal layer 195 also shorts the source region 150 to the body region 160 as is conventionally done. For diode connected transistor cell 120 this configuration effectively forces the gate electrode 175, the source region 150 and the body region 160 to all be at the same potential so that the diode connected transistor cell 120 no longer contributes capacitance to the trench gate MOSFET 100 during operation. The inclusion of a selected portion of the cells for the device being diode connected transistor cells 120 is recognized to thus reduce the total trench MOSFET device capacitance.

For example, when every other cell in the trench gate MOSFET 100 is configured as a diode connected transistor cell 120, the total trench MOSFET capacitance will be reduced roughly by 50%. Mathematically, if the gate electrode in every $N_{th}$ gate is shorted to the source to provide a diode connected transistor cell 120, the capacitance of the trench gate MOSFET device will be reduced by 1/N.

The ratio of conventional active transistor cells 110 to diode connected transistor cells 120 is generally from 3:1 to 10:1. For the planar gate trench MOSFETs described below, the ratio of conventional active transistor cells to diode connected transistor cells is generally larger, such as 10:1 to 100:1. The % of diode connected transistor cells will generally depend on specific circuit application and the design objective, keeping in mind that when shorting the gate electrode to the source there is a slight increase in Rdson.

Figure 2:
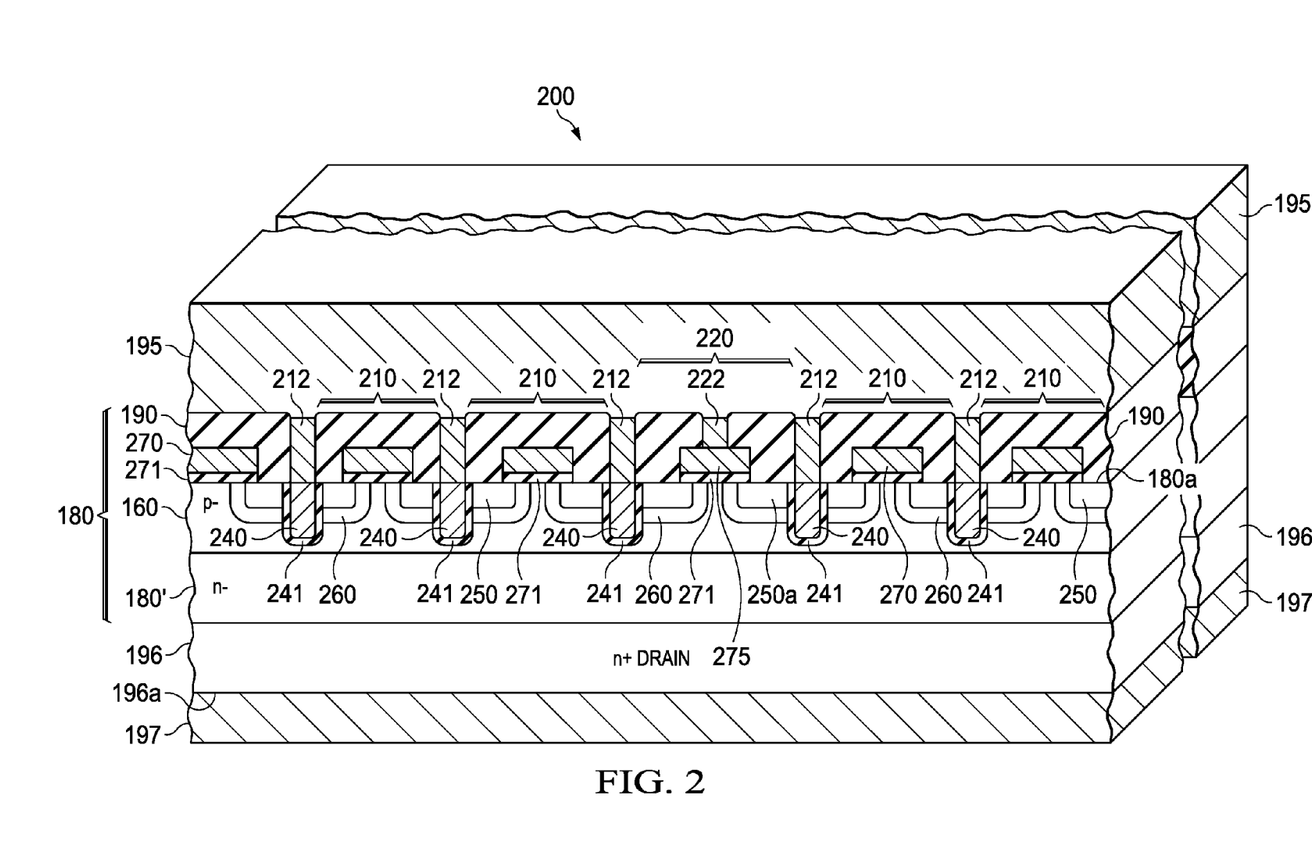
FIG. 2 depicts an example planar gate trench MOSFET including a plurality of conventional active transistor cells and a diode connected transistor cell, according to an example embodiment.

FIG. 2 depicts a simplified cross-section view of an example planar gate trench MOSFET device 200 (planar gate trench MOSFET 200), which embodies some disclosed aspects. The planar gate trench MOSFET 200 includes dielectric lined trenches (240/241) with a polysilicon filler 240 lined by a dielectric layer 241 to provide field plates (sometimes referred to as "RESURF) trenches) on both sides of the gate stacks for the conventional active transistor cells 210 and a diode connected transistor cell 220. Conventional active transistor cells 210 are shown having a gate stack comprising a gate electrode 270 on a gate dielectric 271, and diode connected transistor cell 220 is shown having a gate stack shown as gate electrode 275 on gate dielectric 271.

A n+ doped source region 250 for conventional active transistor cells 210 and source region 250a for diode connected transistor cell 220 is on the top surface 180a of the semiconductor layer 180 between the gate stacks and the trenches 240/241, and the substrate 196 is shown as an n+ substrate which provides a drain for the device having an semiconductor layer 180 thereon that provides a drain drift region 180'. Although a single gate is shown for each of the cells 210, 220, the respective cells may also have a dual gate. The planar gate trench MOSFET 200 in this embodiment can be formed by a process flow for conventional MOSFETs such as including ion implantation or diffusion to form the p-doped body regions 260 and source regions 250 and 250a.

The surface 180a includes a dielectric layer 190 thereon. In this embodiment, the dielectric film material can be silicon dioxide. Alternatively, the dielectric film 190 may comprise other dielectric material such as silicon nitride or other dielectrics. As with trench gate MOSFET 100, contact holes 212 are formed into the planar gate MOSFET 200 through the dielectric layer 190 that enable the source metal layer 195 to short the source regions 250 and 250a to the body regions 260.

FIG. 2 also depicts a contact hole 222 through the dielectric layer 190 that reaches the top of the gate electrode 275 for the diode connected transistor cell 220. The contact holes 212 and 222 are filled with an electrically conductive material such as tungsten or doped polysilicon, and the conductive columns are collectively tied to the source metal layer 195.

The gate electrodes 270 for the conventional active transistor cells 210 are separately tied together by another metallic or polysilicon element which is generally connected to the gate terminal of the device package. When the planar gate trench MOSFET 200 is an enhancement device, provided the device is properly biased, an inversion channel forms in the body region 260 under the gate 270. Electrical current flows through the channel when an electric field gradient is established between the source and the drain. If the body region is doped more heavily with n-type dopant (PMOS), the current is carried through the channel by holes; if it is doped more heavily with p-type dopant (NMOS), electrons.

It takes a finite amount of time for a MOSFET to reach this operating condition, after external voltages are applied to the device terminals. In a simplified model, the planar gate trench MOSFET 200 may be viewed as a combination of capacitor components, among them there is a gate to body capacitor, a gate to source capacitor, and a gate to drain capacitor.

Similar to the trench gate MOSFET 100 depicted in FIG. 1, when the planar gate trench MOSFET 200 is used as a switch in an electrical circuit, the amount of time it takes to charge each of the capacitive components determines the switching speed of the MOSFET. As the number of cells increase per unit device area due to the shrinking feature size of individual planar gate trench MOSFET cells, the total capacitance of the device increases proportionally, the total capacitance being roughly the arithmetic sum of the individual cell capacitance. As a result, a planar gate trench MOSFET device with a greater number of cells switches slower.

Similar to a trench gate MOSFET, the planar gate trench MOSFET device also has resistive components, among them there is resistance associated with the conductive leads, and the finer the lead width, the higher the resistance per unit length. There is also resistance associated with the contacts. And there is resistance associated with the substrate 196 including and the drain drift region 180'. The total resistance of the planar gate trench MOSFET 200, determines the power loss when the device is conducting current. The higher the device resistance when the switch is in its "on" state, Rdson, the more the power loss.

The performance of a planar gate trench MOSFET as a power switching device is sometimes designated by the product of Rdson and gate charge Qg being the total charge that is needed to fully bias the device terminals, usually given as Rdson*Qg or Qgd to obtain the FOM of the device. Occasionally, Rsp is used for the FOM for the device, but then Qg for the device area would need to normalized. As noted above, a lower FOM reflects better device performance.

The Inventors discovered that the while the planar gate trench MOSFET's capacitance increases linearly with the number of MOSFET cells per unit device area, the total Rdson decreases at a slower rate. With this recognition, the Inventors configured device structures and improved on FOM heretofore not achieved.

As depicted in FIG. 2, the planar gate trench MOSFET cells associated with diode connected transistor cell 220 is inactivated as a transistor and thus functions as a diode connector transistor cell from the switching device as its gate electrode 275 is electrically connected to its source 250a and body region 260 by the source metal layer 195. This configuration effectively forces the gate electrode 275, the source region 250 and the body region 260 to be at the same voltage so it no longer contributes capacitance to the device. The inclusion of some of the cells being diode connector transistor cells 220 thus reduces the total MOSFET device capacitance.

When every other cell in the device is inactivated as a transistor as diode connected transistor cell 220, the total MOSFET capacitance will be reduced by 50%. Mathematically speaking, if every $N_{th}$ gate electrode is shorted to the source to provide a diode connected transistor cell, the capacitance of the planar gate trench MOSFET device 200 will be reduced by 1/N.

Disclosed embodiments allows maintaining an aggressive cell pitch to meet Rdson objectives and does not requires extra processing steps, only a modification in cell layout. Moreover, disclosed embodiments do not require the use of TBO (thick bottom oxide) to reduce Cgd as others have used to meet Ron objectives.

EXAMPLES

Disclosed embodiments are further illustrated by the following specific Examples, which should not be construed as limiting the scope or content of this Disclosure in any way.

Figure 3:
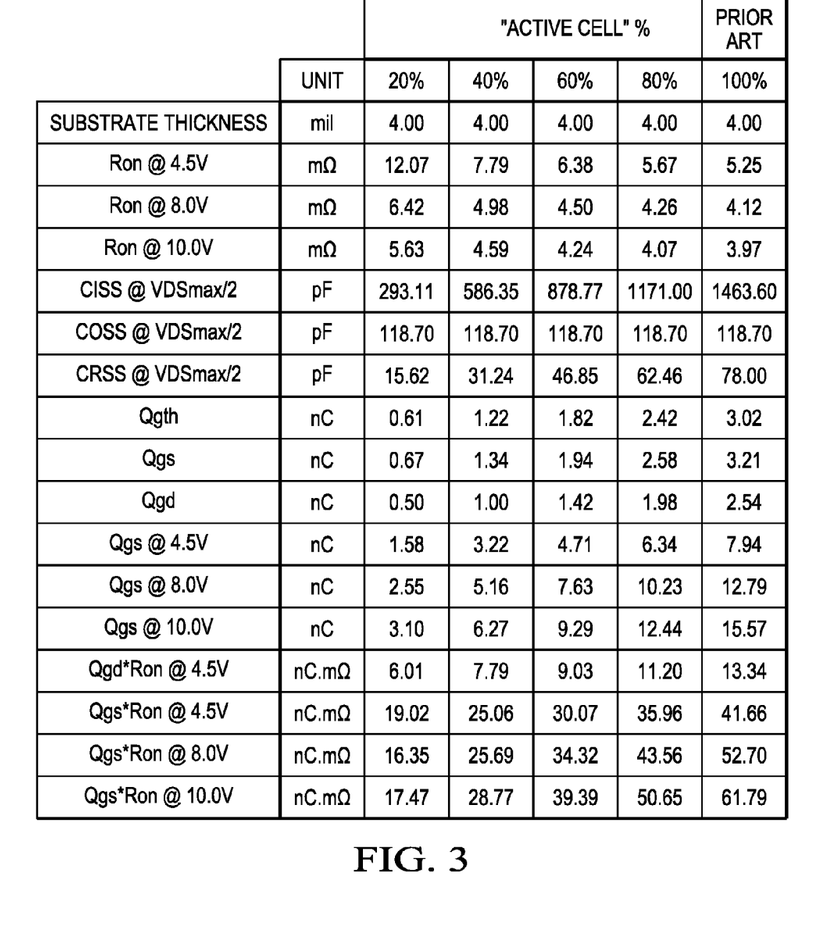
FIG. 3 shows a data table obtained from Simulation Program with Integrated Circuit Emphasis (SPICE) modeling to simulate Rdson (shown as Ron), various capacitance (C) and charge (Q) effects obtained by adding different percentages of disclosed diode connected transistor cells to a trench gate MOSFET device for Ron @ 4.5V, 8.0V and 10.0V.

FIG. 3 shows a data table obtained from SPICE modeling to simulate Rdson (shown as Ron throughout, and referred to below as Ron), various capacitance and charge (Q) effects of adding a different percentages of disclosed diode connected transistor cells to a trench gate MOSFET for Ron @ 4.5V, 8.0V and 10.0V. CISS, CRSS and COSS @ VDSmax/2 Qgth, Qgd, Qgs @ 4.5V, 8.0V 10.0V FOM (Qgd*Ron) were calculated from simulated parameters. Conventional transistor cells are represented as "active cells" in FIG. 3. The input capacitance is shown as Ciss, the reverse transfer capacitance Crss, and the output capacitance as Coss. Regarding the charges, the gate-to-source charge required to charge gate to the threshold voltage is shown as Qgth, the gate-source charge to the Miller plateau voltage ($V_{GP}$) as Qgs, and the gate-drain charge as Qgd from $V_{GP}$ to the end of the Miller plateau Ron is seen to increase as the active cell % decreases; however, the rate of Ron reduction is less than linear. Since Ron is comprised of the drain drift region, substrate and FET channel resistance; the substrate remains same with a change to the active cell %; while the total FET channel resistance increases with reduction of active cell %. CRSS is seen to decrease linearly with reduction of active cell %. CISS=Cgs+CRSS; both Cgs and CRSS decrease linearly with active cell % reduction; therefore CISS follows similar trend COSS=Cds+CRSS; as the source and gate are connected in the diode connected cells, CRSS for those cells are added to Cds. Therefore reduction of CRSS are added to Cds which results constant COSS. Qgth, Qgd, Qgs @ 4.5V, 8.0V and 10.0V are all seen to vary linearly with active cell %. The FOM, being the product of Qgs and Ron, is seen to decrease with a reduction in active cells % due to the gate charge falling at faster rates than rate of increase of Ron.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

What is claimed is:

1. A transistor device, comprising:
a drain region;
a source region positioned above the drain region;
an active transistor cell including a first gate electrode positioned above and isolated from a portion of the source region adjacent to the first gate electrode; and
a diode connected transistor cell positioned adjacent to the active transistor cell, the diode connected transistor cell including a second gate electrode positioned above and coupled to the source region.

2. The transistor device of claim 1, further comprising:
a source metal layer formed above the first and second gate electrodes, the source metal layer connected to the source region;
a dielectric layer insulating the first gate electrode from the source metal layer and the source region; and
a gate contact structure penetrating the dielectric layer and connecting the second gate electrode to the source metal layer.

3. The transistor device of claim 1, further comprising:
a body region positioned between the drain region and the source region;
a trench penetrating the source region and the body region, the trench positioned between the active transistor cell and the diode connected transistor cell; and
a body contact structure occupying the trench to couple the source region with the body region.

4. The transistor device of claim 3, further comprising:
a source metal layer formed above the first and second gate electrodes, the source metal layer connected to the source region; and
a dielectric layer insulating the first gate electrode from the source metal layer and the source region,
wherein the body contact structure extending above the trench and coupling the source region and the body region to the source metal layer.

5. The transistor device of claim 1, wherein the portion of the source region is symmetrically positioned around and under the first gate electrode.

6. The transistor device of claim 1, further comprising:
a drain drift region positioned between the drain region and the source region.

7. The transistor device of claim 1, wherein the active transistor cell includes a first and second active transistor cells positioned symmetrically around the diode connected transistor cell.

8. The transistor device of claim 1, wherein:
the active transistor cell includes N active transistor cells positioned laterally around the diode connected transistor cell; and
N is a positive integer ranges from 3 to 10.

9. A transistor device, comprising:
a drain layer;
a source layer positioned above the drain layer and having a first source region and a second source region separated from the first source region;
a source metal layer positioned above the source layer and electrically coupling the first source region to the second source region;
a first transistor cell overlapping the first source region, the first transistor cell including a first gate electrode positioned above and free from being directly connected to the first source region; and
a second transistor cell overlapping the second source region, the second transistor cell including a second gate electrode positioned above coupled to the second source region via the source metal layer.

10. The transistor device of claim 9, further comprising:
a dielectric layer separating the first gate electrode from the source metal layer and the first source region; and
a gate contact structure penetrating the dielectric layer and connecting the second gate electrode to the source metal layer.

11. The transistor device of claim 9, further comprising:
a body layer positioned between the drain layer and the source layer;
a trench penetrating the source layer and the body layer, the trench positioned between the first transistor cell and the second transistor cell; and
a body contact structure occupying the trench to couple the source layer with the body layer.

12. The transistor device of claim 11, further comprising:
a dielectric layer insulating the first gate electrode from the source metal layer and the source layer,
wherein the body contact structure extending above the trench and coupling the source layer and the body layer to the source metal layer.

13. The transistor device of claim 9, wherein the first source region is symmetrically positioned around and under the first gate electrode.

14. The transistor device of claim 9, further comprising:
a drain drift layer positioned between the drain layer and the source layer.

15. The transistor device of claim 9, wherein:
the first transistor cell includes N active transistor cells positioned laterally around the second transistor cell; and
N is a positive integer ranges from 3 to 10.

16. An integrated circuit, comprising:
trench MOSFET devices, each having:
a drain layer;
a source layer positioned above the drain layer and having a first source region and a second source region separated from the first source region;
a source metal layer positioned above the source layer and electrically coupling the first source region to the second source region;
a first transistor cell overlapping the first source region, the first transistor cell including a first gate electrode positioned above and free from being directly connected to the first source region; and
a second transistor cell overlapping the second source region, the second transistor cell including a second gate electrode positioned above and coupled to the second source region via the source metal layer.

17. The integrated circuit of claim 16, wherein each of the trench MOSFET devices includes:

a dielectric layer separating the first gate electrode from the source metal layer and the first source region; and a gate contact structure penetrating the dielectric layer and connecting the second gate electrode to the source metal layer.

18. The integrated circuit of claim 16, wherein each of the trench MOSFET devices includes:

a body layer positioned between the drain layer and the source layer;

a trench penetrating the source layer and the body layer, the trench positioned between the first transistor cell and the second transistor cell; and a body contact structure occupying the trench to couple the source layer with the body layer.

19. The integrated circuit of claim 16, wherein the first source region is symmetrically positioned around and under the first gate electrode.

20. The integrated circuit of claim 16, wherein each of the trench MOSFET devices includes:

a drain drift layer positioned between the drain layer and the source layer.

\* \* \* \* \*